(12) United States Patent
Abedifard et al.

(10) Patent No.: US 6,304,488 B1
(45) Date of Patent: Oct. 16, 2001

(54) CURRENT LIMITING NEGATIVE SWITCH CIRCUIT

(75) Inventors: Ebrahim Abedifard, Sunnyvale; Frankie F. Roohparvar, Miltitas, both of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/649,448

(22) Filed: Aug. 25, 2000

(51) Int. Cl.$^7$ .................................................. G11C 16/06
(52) U.S. Cl. ............................. 365/185.23; 365/185.18; 365/189.09; 365/230.06
(58) Field of Search ..................... 365/185.09, 185.11, 365/185.2, 189.09, 185.18, 230.06

(56) References Cited

U.S. PATENT DOCUMENTS

| | | |
|---|---|---|
| 5,041,886 | 8/1991 | Lee . |
| 5,287,536 * | 2/1994 | Schreck et al. ................. 365/230.06 |
| 5,289,410 | 2/1994 | Katti . |
| 5,313,424 | 5/1994 | Adams et al. . |
| 5,392,253 * | 2/1995 | Atsumi et al. ................... 365/230.06 |
| 5,422,908 | 6/1995 | Schilling . |
| 5,498,886 | 3/1996 | Hsu et al. . |
| 5,537,354 | 7/1996 | Mochizuki et al. . |
| 5,587,680 | 12/1996 | Smith . |
| 5,600,605 | 2/1997 | Schaefer . |
| 5,666,321 | 9/1997 | Schaefer . |
| 5,751,039 | 5/1998 | Kauffman et al. . |
| 5,787,457 | 7/1998 | Miller et al. . |
| 5,818,758 | 10/1998 | Wojciechowski . |
| 5,936,903 | 8/1999 | Jeng et al. . |
| 5,966,331 * | 10/1999 | Shiau et al. ..................... 365/185.23 |
| 5,995,438 | 11/1999 | Jeng et al. . |
| 6,005,813 | 12/1999 | Waller et al. . |
| 6,026,465 | 2/2000 | Mills et al. . |
| 6,041,000 | 3/2000 | McClure et al. . |
| 6,137,133 | 10/2000 | Kauffman et al. . |
| 6,141,247 | 10/2000 | Roohparvar et al. . |

OTHER PUBLICATIONS

Keeth, et al., "DRAM circuit design: a tutorial," IEEE Press, 2001, pp. 16–23, 142–153.

Micron Semiconductor Products, Inc., "2Mb, Smart 5 BIO-S–Optimized Boot Block Flash Memory," *Flash Memory* www.micron.com, copyright 2000, Micron Technology, Inc., pp.1–12.

Micron, "16 Mb:×16 SDRAM" *Synchronous DRAM,* www-.micron.com, copyright 1999 Micron Technology, Inc., pp. 1–51.

\* cited by examiner

*Primary Examiner*—Son Mai
(74) *Attorney, Agent, or Firm*—Fogg, Slifer & Polglaze, P.A.; Thomas W. Leffert

(57) ABSTRACT

Negative switch circuits are arranged to have a first electrical path coupled between an input and an output of the negative switch circuit and a second electrical path in parallel with the first electrical path for selectively isolating a load from a negative potential node. The first electrical path presents an open circuit in response to a first state of a first control signal and presents a closed circuit in response to a second state of the first control signal. The second electrical path presents an open circuit in response to either a first state of a second control signal or a condition of the load indicative of a defect associated with the load, and presents a closed circuit in response to a second state of the second control signal in combination with a condition of the load not indicative of such a defect. Such negative switch circuits are adaptable to isolate defective portions of a memory device from a negative charge pump during block erase operations. In operation, the negative switch circuit isolates the input of the negative switch circuit from the output of the negative switch circuit if a detected condition of the output of the negative switch circuit is indicative of a defect while permitting coupling of the input of the negative switch circuit to the output of the negative switch circuit if the detected condition of the output of the negative switch circuit is not indicative of a defect.

52 Claims, 9 Drawing Sheets

| Vcc | 1* | | 54 | Vss |
| DQ0 | 2 | | 53 | DQ15 |
| VccQ | 3 | | 52 | VssQ |
| DQ1 | 4 | | 51 | DQ14 |
| DQ2 | 5 | | 50 | DQ13 |
| VssQ | 6 | 650 | 49 | VccQ |
| DQ3 | 7 | | 48 | DQ12 |
| DQ4 | 8 | | 47 | DQ11 |
| VccQ | 9 | | 46 | VssQ |
| DQ5 | 10 | | 45 | DQ10 |
| DQ6 | 11 | | 44 | DQ9 |
| VssQ | 12 | | 43 | VccQ |
| DQ7 | 13 | | 42 | DQ8 |
| Vcc | 14 | | 41 | Vss |
| DQML | 15 | | 40 | RP# |
| WE# | 16 | | 39 | DQMH |
| CAS# | 17 | | 38 | CLK |
| RAS# | 18 | | 37 | CKE |
| CS# | 19 | | 36 | VccP |
| BA0 | 20 | | 35 | A11 |
| BA1 | 21 | | 34 | A9 |
| A10 | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

*Fig. 6A*

CURRENT LIMITING NEGATIVE SWITCH CIRCUIT

TECHNICAL FIELD OF THE INVENTION

The present invention relates generally to semiconductor devices, and in particular, the present invention relates to isolation of defective portions from remaining portions of a non-volatile semiconductor memory device using a current limiting negative switch circuit.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

For speed of operation, erasures of non-volatile memory devices, such as flash memory devices, are generally carried out in blocks rather than individual memory cells. As such, a defect in one portion of the block may cause the entire block to be unusable. Global failures of an entire block may not be repairable through redundancy. To avoid such global failures, a defective portion of the memory block must generally be isolated to some degree from remaining portions of the memory block during an erase operation.

For the reasons stated above, and for other reasons stated below which will become apparent to those skilled in the art upon reading and understanding the present specification, there is a need in the art for alternate methods and circuits for isolating defective portions in non-volatile flash memory devices.

SUMMARY OF THE INVENTION

The above-mentioned problems with memory devices and other problems are addressed by the present invention and will be understood by reading and studying the following specification. The various embodiments of the invention provide for selective coupling of a negative potential node, such as the output of a negative charge pump, to a load, such as a potential node supplying a word line driver in a non-volatile memory device.

Erase operations in non-volatile memory devices are often carried out in blocks rather than individual cells. Such block erase operations generally apply a negative erase voltage from a negative potential node to each word line of the memory block. If a word line is shorted to a bit line, the negative erase voltage may be incapable of reaching the levels necessary to achieve erasure of the memory block. With the inability to effectively erase an entire block of memory cells, the memory device may be commercially unacceptable. Various embodiments described herein utilize a current limiting negative switch circuit to decouple a defective portion of a memory block, i.e., a portion containing such a shorted word line, from the negative potential node while permitting coupling of at least a portion of the remaining, non-defective word lines to the negative potential node.

For one embodiment, the invention provides a negative switch circuit. The negative switch circuit includes a first electrical path coupled between an input and an output of the negative switch circuit and having a first switch, a second electrical path in parallel with the first electrical path and having a second switch and a third switch coupled in series, and a feedback controller having an input coupled to the output of the negative switch circuit. The first switch is coupled to receive a first control signal, the second switch is coupled to receive a second control signal, and the third switch is coupled to receive a feedback control signal from an output of the feedback controller.

For another embodiment, the invention provides a negative switch circuit. The negative switch circuit includes a first electrical path coupled between an input and an output of the negative switch circuit and a second electrical path coupled in parallel with the first electrical path. The first electrical path is adapted to present an open circuit between the input and the output of the negative switch circuit in response to a first state of a first control signal and to present a closed circuit between the input and the output of the negative switch circuit in response to a second state of the first control signal. The second electrical path is adapted to present an open circuit between the input and the output of the negative switch circuit in response to a first state of a second control signal and to permit a closed circuit between the input and the output of the negative switch circuit in response to a second state of the second control signal. The second electrical path is further adapted to present an open circuit between the input and the output of the negative switch circuit in response to a first state of a feedback control signal regardless of the state of the second control signal and to permit a closed circuit between the input and the output of the negative switch circuit in response to a second state of the feedback control signal when the second control signal is in the second state.

For a further embodiment, the invention provides a method of selectively coupling a negative potential node to a load. The method includes coupling the negative potential node to the load during a first period, decoupling the negative potential node from the load during a first phase of a second period, and detecting a condition of the load. If the condition of the load is not indicative of a defect associated with the load, the method provides for coupling the negative potential node to the load during a second phase of the second period. If the condition of the load is indicative of a defect associated with the load, the method provides for leaving the negative potential node decoupled from the load during the second phase of the second period.

For yet another embodiment, the invention provides a method of erasing at least a portion of a block of non-volatile memory cells. The method includes activating a plurality of word line drivers of the block of non-volatile memory cells, wherein each word line driver is supplied by a high-side potential node and a low-side potential node and has an output coupled to a word line, and wherein each word line is coupled to at least one memory cell of the block of non-volatile memory cells. The method further includes coupling each low-side potential node to a negative potential node during a first period, thereby pulling each low-side potential node down to a first voltage level, and decoupling each low-side potential node from the negative potential node during a first phase of a second period, thereby permitting each word line associated with one of the plurality of word line drivers to electrically float. The method still further includes detecting a voltage level of each low-side potential node, wherein a voltage level equal to or above a trip point is indicative of an electrical short associated with the low-side potential node and a voltage level below the trip point is indicative of electrically floating word lines. If the detected voltage level for a given low-side potential node is indicative of electrically floating word lines, the method provides for coupling such low-side potential nodes to the negative potential node, thereby producing coupled low-side potential nodes. If the detected voltage level for a given low-side potential node is indicative of an electrical short, the method provides for leaving each such low-side potential node decoupled from the negative potential node, thereby producing decoupled low-side potential nodes. The method still further includes pulling each coupled low-side potential node down to an erase voltage, thereby erasing memory cells of the block of non-volatile memory cells associated with the coupled low-side potential nodes.

For a still further embodiment, the invention provides a non-volatile memory device. The non-volatile memory device includes an array of non-volatile memory cells arranged in addressable rows and columns, a plurality of word lines, at least one high-side potential node, at least one low-side potential node, and a plurality of word line drivers. Each word line is coupled to a row of memory cells, each word line driver is associated with a word line, and each word line driver has a high side coupled to a high-side potential node and a low side coupled to a low-side potential node. The non-volatile memory device further includes at least one negative charge pump and at least one negative switch circuit, wherein a negative switch circuit is coupled between each low-side potential node and an output of a negative charge pump. Each negative switch circuit includes a first electrical path coupled between the output of the negative charge pump associated with the negative switch circuit and the low-side potential node associated with the negative switch circuit, wherein the first electrical path has a first switch coupled to receive a first control signal. Each negative switch circuit further includes a second electrical path in parallel with the first electrical path and having a second switch and a third switch coupled in series. Each negative switch circuit still further includes a feedback controller having an input coupled to the low-side potential node associated with the negative switch circuit. The second switch is coupled to receive a second control signal and the third switch is coupled to receive a feedback control signal from an output of the feedback controller.

For another embodiment, the invention provides a synchronous flash memory device. The synchronous flash memory device includes an array of non-volatile flash memory cells arranged in addressable rows and columns, and a command execution logic for receiving at least a system clock input signal, for generating an internal clock signal in response to the system clock input signal, and for generating control signals to control operations performed on the array of non-volatile flash memory cells synchronized to the internal clock signal. The synchronous flash memory device further includes at least one word line, at least one high-side potential node, at least one low-side potential node, and at least one word line driver. Each word line is coupled to a row of memory cells, each word line driver is associated with a word line, and each word line driver has a high side coupled to a high-side potential node and a low side coupled to a low-side potential node. The synchronous flash memory device still further includes at least one negative charge pump, and at least one negative switch circuit, wherein a negative switch circuit is coupled between each low-side potential node and an output of a negative charge pump. Each negative switch circuit includes a first electrical path coupled between its associated negative charge pump and its associated low-side potential node, wherein the first electrical path presents an open circuit in response to a first state of a first control signal, and wherein the first electrical path presents a closed circuit in response to a second state of the first control signal. Each negative switch circuit further includes a second electrical path coupled in parallel with the first electrical path, wherein the second electrical path presents an open circuit in response to either a first state of a second control signal or a voltage level of its associated low-side potential node equal to or above a trip point, and wherein the second electrical path presents a closed circuit in response to a second state of the second control signal and a voltage level of its associated low-side potential node below the trip point.

The invention further provides methods and apparatus of varying scope.

BRIEF DESCRIPTION OF THE DRAWINGS

FIG. 6A is a top view of a memory assembly showing a package pin assignment diagram in accordance with the invention.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, mechanical or electrical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
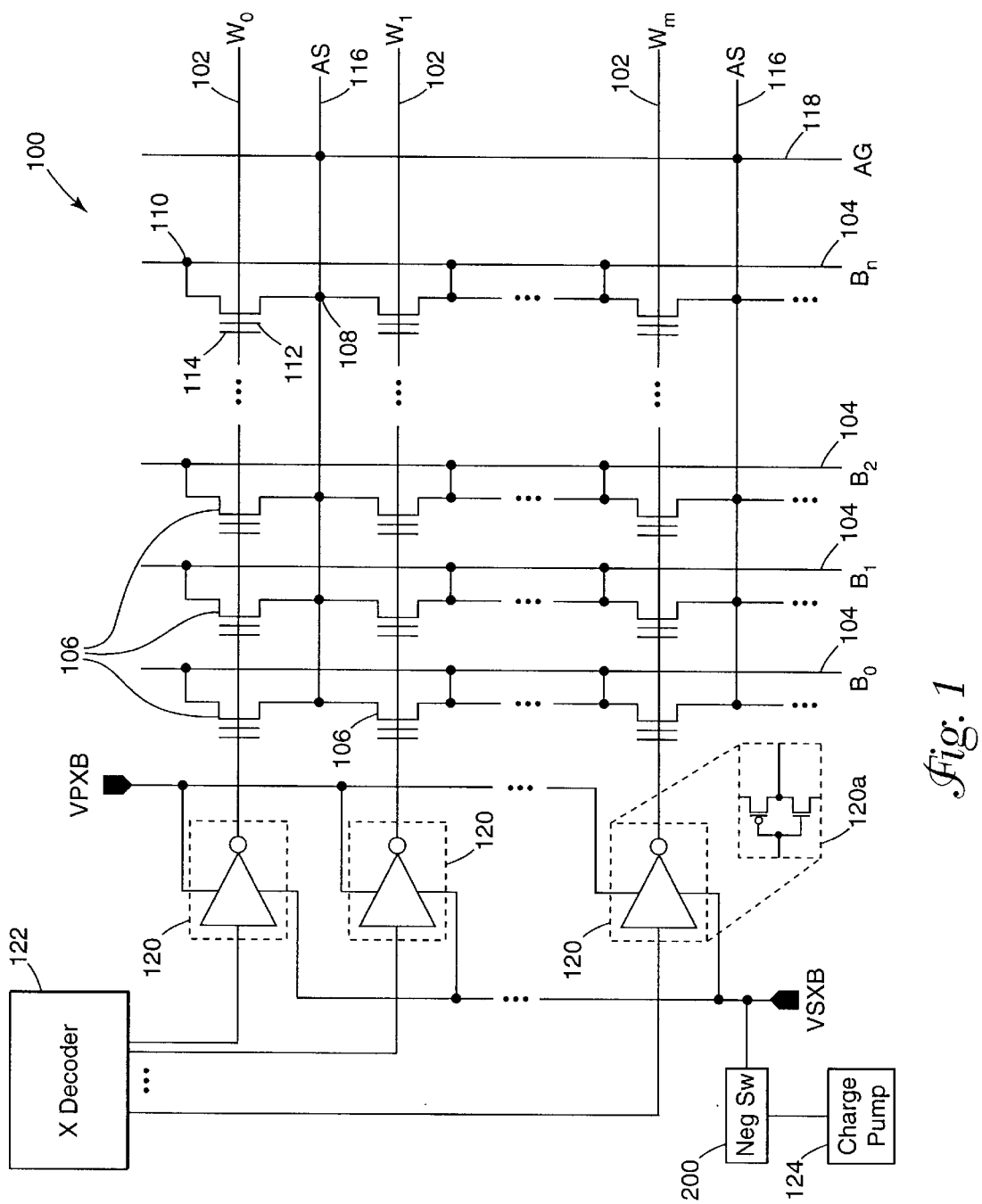
FIG. 1 is a schematic of a portion of a memory block in accordance with one embodiment of the invention.

Arrays of non-volatile memory cells are often configured as floating gate transistors placed at the intersection of word lines and bit lines. The word lines are coupled to the control gates of the floating gate transistors. As used herein, the terms couple, coupled, coupling and the like imply that devices are in electrical communication with one another, noting that electrical communication does not require a direct physical connection. Similarly, the terms decouple, decoupled, decoupling and the like imply that devices are electrically isolated from one another. FIG. 1 is a schematic of a portion of a non-volatile memory block 100 as a portion of a memory array in accordance with one embodiment of the invention.

The detail of memory block 100 is provided to better understand the various embodiments of the invention. However, other memory blocks containing memory cells arranged in addressable rows and columns are suited for use in the invention. Accordingly, the invention is not limited to the specific floating-gate memory cell and layout described with reference to FIG. 1.

As shown in FIG. 1, the memory block 100 includes word lines 102 and intersecting bit lines 104. Floating gate transistors 106 are located at each intersection of a word line 102 and a bit line 104. The floating gate transistors 106 represent the non-volatile memory cells for storage of data. Typical construction of such floating gate transistors 106 include a source 108 and a drain 110 constructed from an N$^+$-type material of high impurity concentration formed in a P-type semiconductor substrate of low impurity concentration, a channel region formed between the source and drain, a floating gate 112, and a control gate 114. Floating gate 112 is isolated from the channel region by a tunneling dielectric and from the control gate 114 by an intergate dielectric. The materials of construction are not critical to the invention, but commonly include doped polysilicon for the gate materials, and silicon oxides, nitrides or oxynitrides for the dielectric materials. Floating gate transistors 106 having their control gates 114 coupled to a word line 102 typically share a common source 108 depicted as array source 116. As shown in FIG. 1, floating gate transistors 106 coupled to two adjacent word lines 102 may share the same array source 116. Floating gate transistors 106 have their drains 110 coupled to a bit line 104. A column of the floating gate transistors 106 are those transistors commonly coupled to a given bit line 104. A row of the floating gate transistors 106 are those transistors commonly coupled to a given word line 102.

The following discussion provides examples of programming, reading and erasing memory cells of the type depicted in FIG. 1. During programming, a positive programming voltage of about 12 volts is applied to the control gate 114 from a potential node VPXB. Potential node VPXB is coupled to and supplies the high side of the word line drivers 120 through the various operations of program, read and erase. Concurrently, a potential node VSXB is coupled to and supplies the low side of the word line drivers 120 through the various operations of program, read and erase. As shown in inset 120a, the word line drivers 120 may be an inverter with the high-side potential node VPXB supplying the source of the p-channel field-effect transistor (pFET) and the low-side potential node VSXB supplying the source of the n-channel field-effect transistor (nFET). The word line drivers 120, in response to control signals from the row decoder circuit 122, select either a high-side potential from potential node VPXB, or a low-side potential from potential node VSXB, as the control voltage applied to the control gates 114 of the floating gate transistors 106. For programming operations, the potential node VPXB supplies the positive programming voltage while the potential node VSXB may generally be held at a ground potential.

The positive programming voltage attracts electrons from the P-type substrate and causes them to accumulate at the surface of channel region. A voltage on the drain 110 is increased to about 6 volts by applying the potential to the associated bit line 104, and the source 108 is connected to a ground potential through an array ground 118 via the array source 116. As the drain-to-source voltage increases, electrons flow from the source 108 to the drain 110 via the channel region. As electrons travel toward the drain 110, they acquire substantially large kinetic energy and are referred to as hot electrons.

The voltages at the control gate 114 and the drain 110 create an electric field in the tunneling dielectric layer, this electric field attracts the hot electrons and accelerates them toward the floating gate 112. At this point, the floating gate 112 begins to trap and accumulate the hot electrons and starts a charging process. Gradually, as the charge on the floating gate 112 increases, the electric field in the tunneling dielectric layer decreases and eventually loses it capability of attracting any more of the hot electrons to the floating gate 112. At this point, the floating gate 112 is fully charged. The negative charge from the hot electrons collected in the floating gate 112 raises the cell's threshold voltage (Vt) above a logic 1 voltage.

For read operations, the potential node VPXB supplies the control voltage representing a first logic level, e.g., logic 1, while the potential node VSXB supplies the control voltage representing a second logic level, e.g., logic 0. A control voltage representing a logic 1 may be a supply voltage, such as Vcc, while a control voltage representing a logic 0 may be a ground potential, such as Vss.

When a control voltage on the control gate 114 is brought to a logic 1 during a read operation, the cell will barely turn on. The control voltage is applied to a word line 102, and thus the control gate 114, in response to control signals received from the row decoder circuit 122. Sensing devices (not shown in FIG. 1), such as sense amplifiers, are used in the memory to detect and amplify the state of the floating gate transistor 106 detected on the bit line 104 during a read operation. The floating gate transistor 106 is coupled to a sense amplifier and the appropriate sense amplifier is coupled to a data output register (not shown in FIG. 1) in response to control signals received from a column decoder circuit (not shown in FIG. 1). Thus, a memory cell is selected by a decoded address and data is read from the memory cell based upon its "on" characteristics.

Electrons are removed from the floating gate 112 to erase the floating gate transistor 106. Many memories, including flash memories, use Fowler-Nordheim (FN) tunneling to erase a memory cell. The erase procedure is accomplished by electrically floating the drain 110, grounding the source 108, and applying a high negative voltage (e.g., −10 to −12 volts) to the control gate 114. This creates an electric field across the tunneling dielectric layer and forces electrons off of the floating gate 112 which then tunnel through the tunneling dielectric layer. For erase operations, the potential node VPXB is generally held at a ground potential while the potential node VSXB supplies the high negative erase voltage.

To supply the high negative erase voltage, the potential node VSXB may be coupled to a negative charge pump 124. As erasures are generally carried out in blocks rather than individual cells, a defect in one portion of the memory block 100 may cause a failure of the erase operation across the entire memory block 100. One such defect is a word line to bit line short, where a word line 102 is shorted to a bit line 104. As an example, if word line $W_0$ is electrically shorted to bit line $B_2$, the negative charge pump 124 may become clamped during an erase operation with all of its output pulled up through this leakage path. As a result, the negative erase voltage will generally be incapable of reaching the levels necessary to achieve erasure of the memory block 100. With the inability to effectively erase an entire block 100 of memory cells, the memory device may be commercially unacceptable. Various embodiments described herein utilize a current limiting negative switch circuit 200 to decouple a defective portion of a memory block 100, i.e., a portion containing such a shorted word line 102, from the negative charge pump 124. By decoupling the defective portion of the memory block 100 from the negative charge pump 124, the output of the negative charge pump 124 is available to the remaining portion of the memory block 100 and an inability to effectively erase the remaining portion of the memory block 100 may be avoided.

Figure 2A:
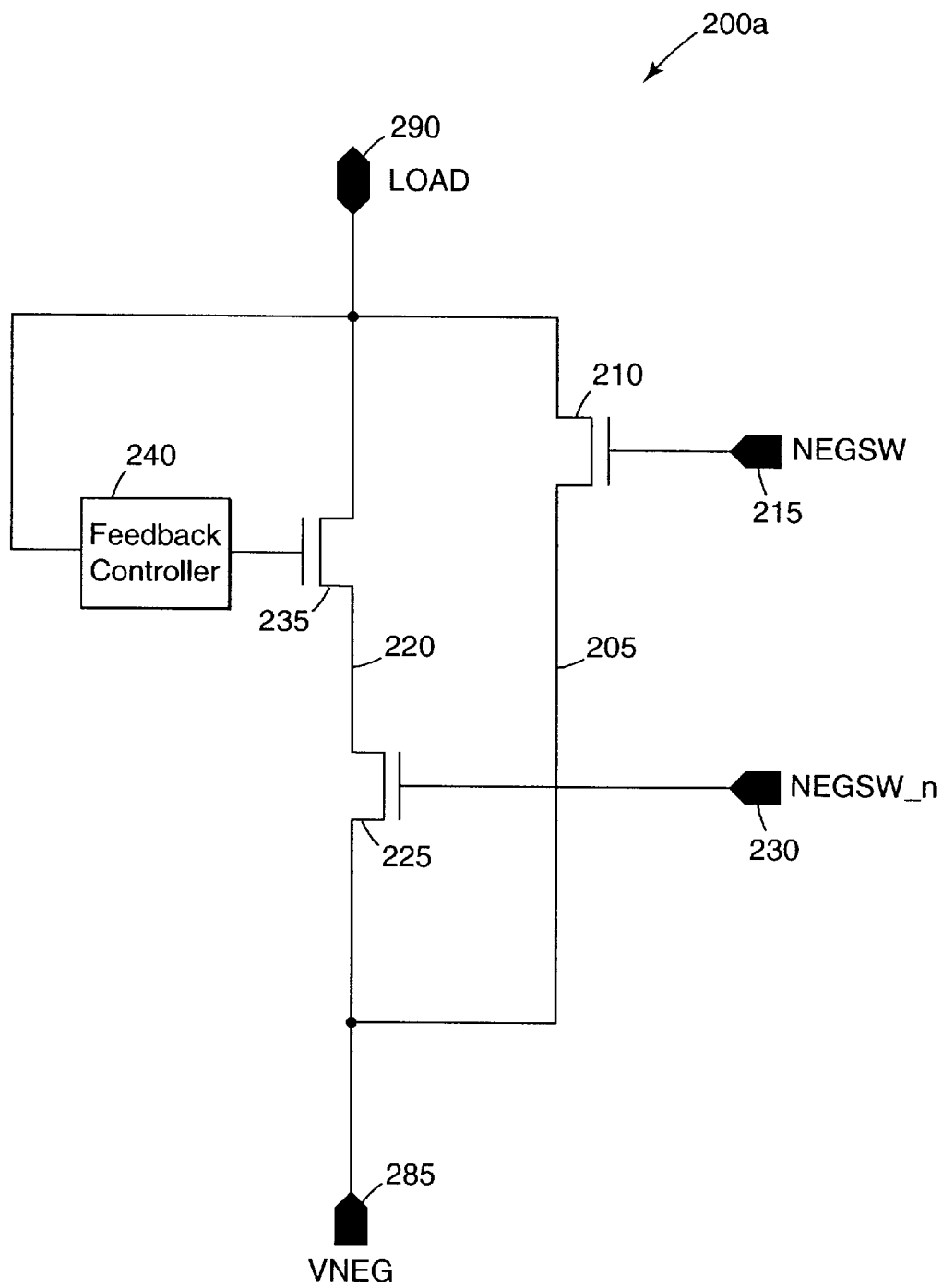
FIGS. 2A–2C are schematics of various negative switch circuits in accordance with the invention.
Figure 2B:
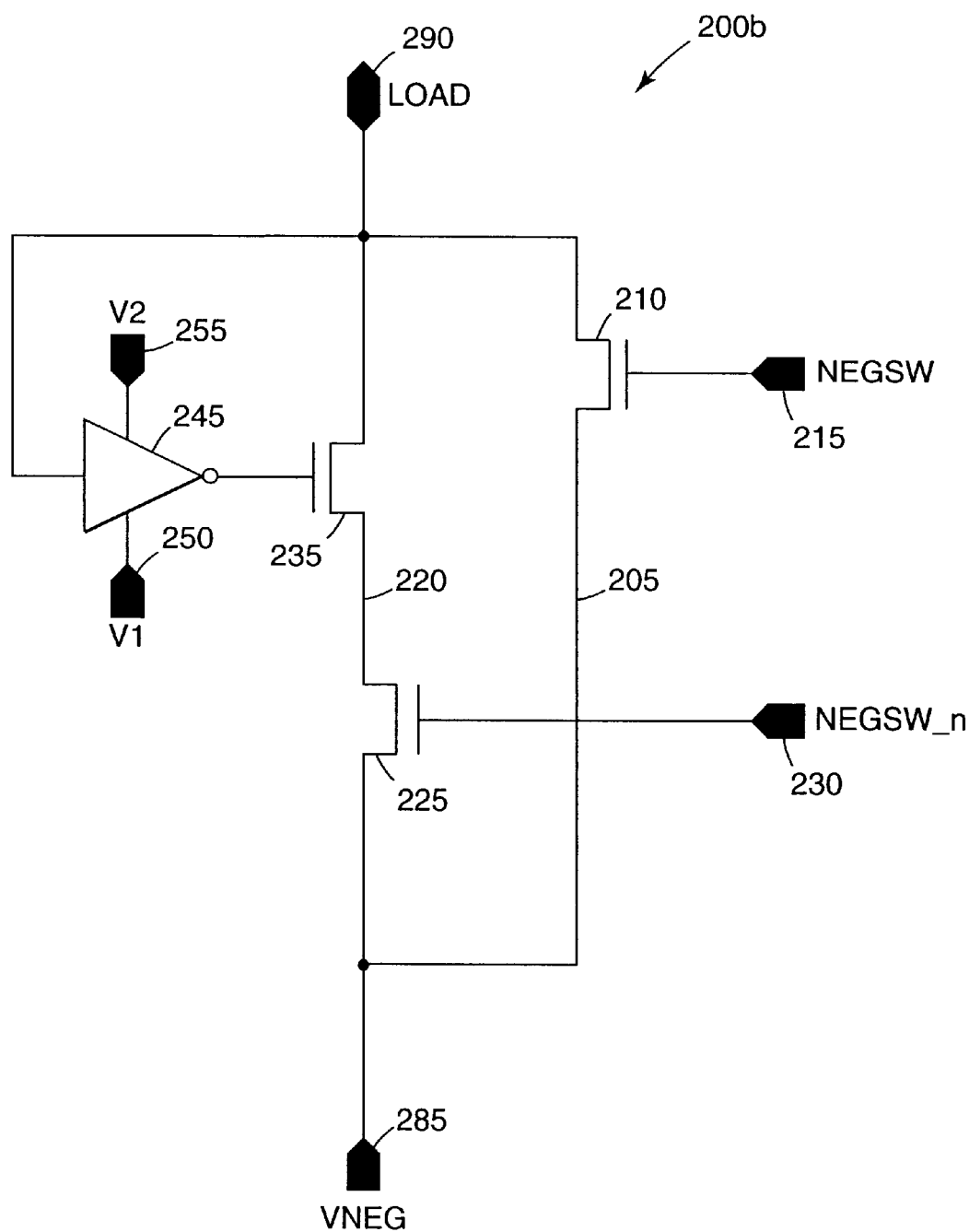
Figure 2C:
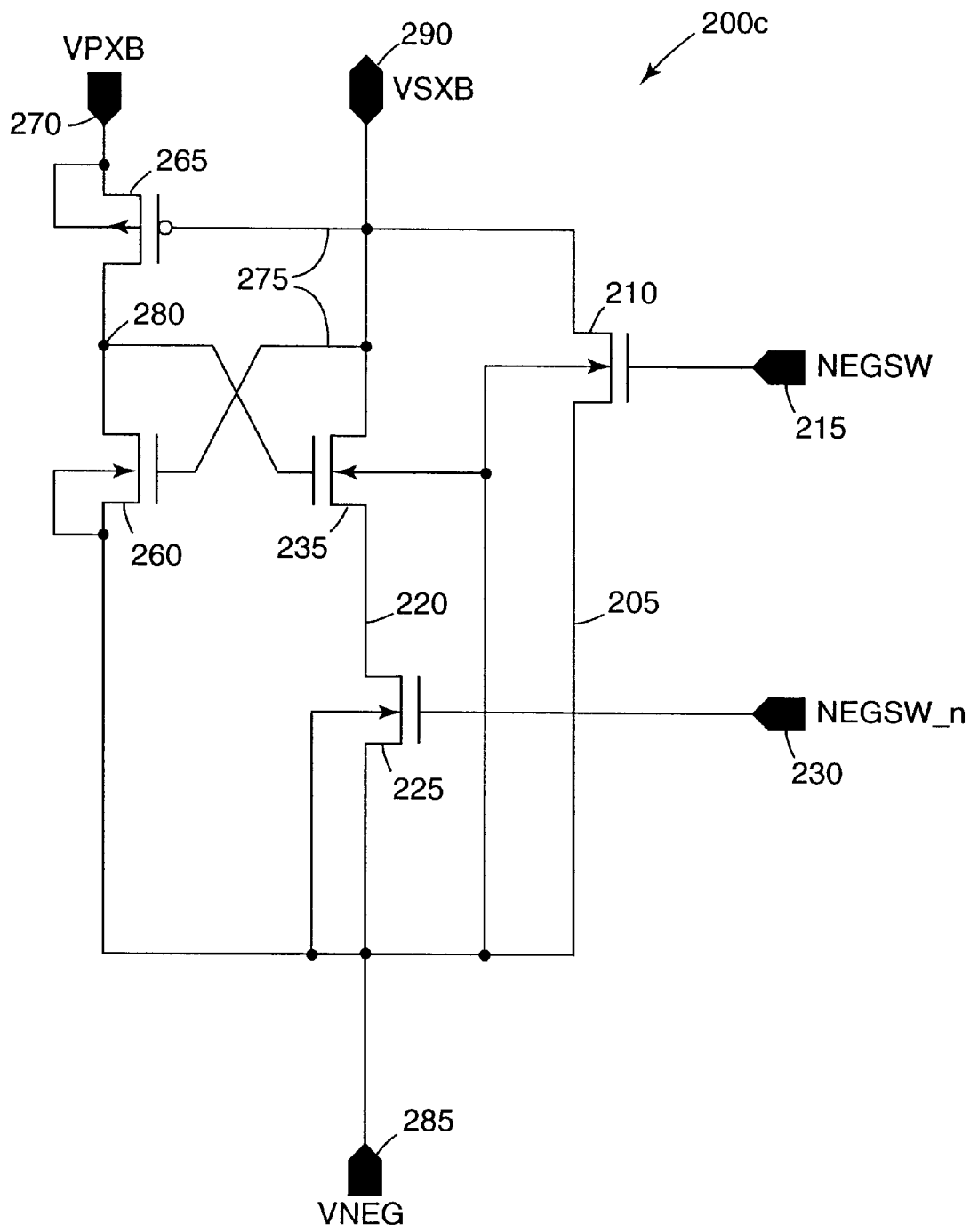

FIGS. 2A–2C are schematics of various embodiments of negative switch circuits 200 in accordance with the invention. The various embodiments utilize a first electrical path and a second electrical path between a negative potential node, such as a negative charge pump, and a load, such as the low side of a word line driver. The first electrical path provides a closed circuit between the negative potential node and the load during a first period and an open circuit during a second period. The second electrical path provides an open circuit between the negative potential node and the load during a first period and utilizes feedback from the load to determine whether to provide a closed circuit during the second period.

In FIG. 2A, negative switch circuit 200a includes a first electrical path 205 and a second electrical path 220 coupled in parallel between the negative potential node (VNEG) 285, as the input of the negative switch circuit 200a, and the load 290, as the output of the negative switch circuit 200a. The first electrical path 205 includes a first switch 210 interposed between the negative potential node 285 and the load 290. The first switch 210 is any selective coupling device and is depicted as an nFET. The first switch 210 selectively presents an open or a closed circuit in response to a first control signal 215, labeled as control signal NEGSW. Using the nFET as an example, the first switch 210 is activated and presents a closed circuit in response to a first logic level or logic 1 applied to its gate by the first control signal 215, and is deactivated and presents an open circuit in response to a second logic level or logic 0 applied to its gate by the first control signal 215. Note that voltage levels representative of the first and second logic levels in this example are generally dependent upon the potential of the body of the FET and may vary during operation of the negative switch circuit 200a.

The second electrical path 220 includes a second switch 225 and a third switch 235 coupled in series between the negative potential node 285 and the load 290. As with the first switch 210, the second switch 225 and the third switch 235 are any selective coupling device. The second switch 225 selectively presents an open or a closed circuit in response to a second control signal 230, labeled as control signal NEGSW_n. The third switch 235 selectively presents an open or a closed circuit in response to an output of a feedback controller 240. The feedback controller 240 detects a condition of the load 290, such as voltage level, and provides a feedback control signal on its output to deactivate the third switch 235 when the condition of the load 290 is indicative of a defect, or to activate the third switch 235 when the condition of the load 290 is not indicative of a defect.

In operation, the first control signal 215 is set to logic 1 during a first period while the second control signal 230 is set to logic 0. This couples the negative potential node 285 to the load 290 by activating the first switch 210, and begins pulling the load 290 to a voltage level toward the potential of the negative potential node 285. At the end of the first period, the first control signal 215 is set to logic 0 to deactivate the first switch 210, thereby decoupling the load 290 from the negative potential node 285. During a first phase of a second period, with both the first switch 210 and the second switch 225 deactivated, the feedback controller 240 detects the condition of the load 290. If the load 290 contains a defect, such as an electrical short, the voltage level of the load 290 may begin to rise to, or equilibrate at, a level unacceptably above the voltage level of the negative potential node 285. In this situation, the feedback controller 240 may deactivate the third switch 235 if the voltage level of the load 290 is equal to or above some predetermined trip point, indicative of a defect in the load 290, and may activate the third switch 235 if the voltage level of the load 290 is below the trip point, not indicative of a defect in the load 290. Using voltage level as the detected condition, the trip point is selected to be indicative of a predetermined acceptable level of current leakage in the load 290 during the first phase of the second period. Voltage levels below the trip point are indicative of an electrically floating load 290 such that charge loss is minimal or substantially non-existent, or is otherwise acceptable.

In a second phase of the second period, the second switch 225 is activated in response to a logic 1 level of the second control signal 230. If the third switch 235 is activated in response to the condition of the load 290, the negative potential node 285 and the load 290 will be coupled through the second electrical path 220. If the third switch 235 is deactivated in response to the condition of the load 290, the negative potential node 285 and the load 290 will be decoupled as both the first switch 210 of the first electrical path 205 and the third switch 235 of the second electrical path 220 will be open or deactivated. Accordingly, the negative switch circuit 200a decouples the negative potential node 285 from the load 290 upon detecting an indication of a defect in the load 290, while permitting coupling of the negative potential node 285 and the load 290 during the second period if no indication of a defect is detected.

FIG. 2B is an embodiment of a negative switch circuit where the feedback controller is an inverter circuit. The negative switch circuit 200b of FIG. 2B includes a first electrical path 205 and a second electrical path 220 coupled in parallel between the negative potential node 285, as the input of the negative switch circuit 200b, and the load 290, as the output of the negative switch circuit 200b. The first electrical path 205 includes a first switch 210 interposed between the negative potential node 285 and the load 290. The first switch 210 is any selective coupling device and selectively presents an open or a closed circuit in response to a first control signal 215, labeled as control signal NEGSW.

The second electrical path 220 includes a second switch 225 and a third switch 235 coupled in series between the negative potential node 285 and the load 290. As with the first switch 210, the second switch 225 and the third switch 235 are any selective coupling device. The second switch 225 selectively presents an open or a closed circuit in response to a second control signal 230, labeled as control signal NEGSW_n. The third switch 235 selectively presents an open or a closed circuit in response to an output of an inverter circuit 245. The inverter circuit 245 detects a condition of the load 290, such as voltage level, and provides a feedback control signal on its output to deactivate the third switch 235 when the condition of the load 290 is indicative of a defect, or to activate the third switch 235 when the condition of the load 290 is not indicative of a defect.

In operation, the first control signal 215 is set to logic 1 during a first period while the second control signal 230 is set to logic 0. This couples the negative potential node 285 to the load 290 by activating the first switch 210, and begins pulling the load 290 toward the potential of the negative potential node 285. At the end of the first period, the first control signal 215 is set to logic 0 to deactivate the first switch 210, thereby decoupling the load 290 from the negative potential node 285. During a first phase of a second period, with both the first switch 210 and the second switch 225 deactivated, the inverter circuit 245 detects the condition of the load 290 through its input. If the load 290 contains a defect, such as a short, the voltage level of the load 290 may begin to rise to, or equilibrate at, a level unacceptably above the voltage level of the negative potential node 285. In this situation, the inverter circuit 245 provides a feedback control signal having a first state, i.e., the voltage level of the low-side potential node (V1) 250, to the third switch 235 if the voltage level of the load 290 is equal to or above the trip point of the inverter circuit 245. The inverter circuit 245 provides a feedback control signal having a second state, i.e., the voltage level of the high-side potential node (V2) 255, to the third switch 235 if the voltage level of the load 290 is less than the trip point of the inverter circuit 245. The trip point of the inverter circuit 245 should be chosen such that voltage levels of the load 290 equal to or above the trip point are indicative of a defect in the load 290. The trip point of the inverter circuit 245 may be adjusted primarily through selection of the voltage levels of the potential nodes 250 and 255, the trip point being approximately midway between these voltage levels. The feedback control signal applied to the third switch 235 having the first state serves to deactivate the third switch 235, thus presenting an open circuit across the third switch 235. The feedback control signal applied to the third switch 235 having the second state serves to activate the third switch 235, thus presenting a closed circuit across the third switch 235.

In a second phase of the second period, the second switch 225 is activated in response to a logic 1 level of the second control signal 230. If the third switch 235 is activated, the negative potential node 285 and the load 290 will be coupled through the second electrical path 220. If the third switch 235 is deactivated, the negative potential node 285 and the load 290 will be decoupled. Accordingly, the negative switch circuit 200b decouples the negative potential node 285 from the load 290 upon detecting an indication of a defect in the load 290, while permitting coupling of the negative potential node 285 and the load 290 during the second period if no indication of a defect is detected.

FIG. 2C is another embodiment of a negative switch circuit where the feedback controller is an inverter circuit. The negative switch circuit 200c of FIG. 2C will be discussed with particular application to the memory block 100 of FIG. 1, although the memory block of FIG. 1 is not limited to a negative switch circuit as depicted in FIG. 2C.

The negative switch circuit 200c of FIG. 2C includes a first electrical path 205 and a second electrical path 220 coupled in parallel between the input 285 of the negative switch circuit 200c and the output 290 of the negative switch circuit 200c. The input 285 of the negative switch circuit 200c may be coupled to the output (VNEG) of a negative charge pump 124 of memory block 100 while the output 290 of the negative switch circuit 200c may be coupled to the low-side potential node VSXB of the memory block 100. For one embodiment, the first electrical path 205 is a low-resistance path relative to the second electrical path 220. For most operations, e.g., wait state, read operation and program operation, the first electrical path 205 is a ground path such that a low resistance is desirable. The second electrical path 220 is a pull-down path such that a more highly resistive path is desirable to limit current flow.

The first electrical path 205 includes a first switch 210 interposed between the input 285 and output 290 of the negative switch circuit 200c. The first switch 210 selectively presents an open or a closed circuit in response to a first control signal 215, labeled as control signal NEGSW. The first switch 210 is depicted as an nFET back-biased to the negative potential of the input 285, i.e., its body is coupled to the input 285. For one embodiment, the first switch 210 has a relatively large W/L ratio such that it presents a low resistance path when activated.

The second electrical path 220 includes a second switch 225 and a third switch 235 coupled in series between the input 285 and output 290 of the negative switch circuit 200c. The second switch 225 selectively presents an open or a closed circuit in response to a second control signal 230, labeled as control signal NEGSW_n. The third switch 235 selectively presents an open or a closed circuit in response to a feedback control signal. The second switch 225 and the third switch 235 are each nFETs back-biased to the negative potential of the input 285. For one embodiment, the second switch 225 and the third switch 235 each have a W/L ratio that is small relative to the W/L ratio of the first switch 210. As such, the second switch 225 and the third switch 235 present a relatively high resistance path when activated as compared to the first switch 210.

The negative switch circuit 200c further includes a fourth switch 260. The fourth switch 260 is an nFET back-biased to the input 285. The fourth switch 260 has its source coupled to the input 285 and its gate coupled to the output 290. The negative switch circuit 200c further includes a fifth switch 265. The fifth switch 265 is a pFET back-biased to a potential node 270 such as the high-side potential node VPXB of the memory block 100. The fifth switch 265 has its source coupled to the potential node 270 and its gate coupled to the output 290. The fourth switch 260 and the fifth switch 265 thus operate as an inverter circuit having its input 275 coupled to the output 290 of the negative switch circuit 200c and its output 280 coupled to the gate of the third switch 235. Potential node 270 is generally held at a ground potential, but may supply any voltage level above the voltage level of the input 285 such that a trip point of the inverter circuit is indicative of a defect in a portion of the memory block 100. For one embodiment, the fourth switch 260 and the fifth switch 265 are fabricated with substantially the same W/L ratio such that the trip point is approximately midway between the potential of the negative potential node 285 and the potential of the potential node 270

In a wait state of the memory block 100, as well as during read and program operations, the first control signal 215 is set to logic 1 to bypass the second electrical path 220, the second control signal 230 is set to logic 0 to open the second electrical path, and the potential at the input 285 of the negative switching circuit 200c is held at a ground potential. In an erase operation, the negative charge pump 124 begins pulling down on the input 285 of the negative switching circuit 200c. The first control signal 215 is held at logic 1 during a first period of the erase operation while the second control signal 230 is held at logic 0. The negative charge pump 124 is thus coupled to the low-side potential node VSXB through the first electrical path 205 by activation of the first switch 210, and begins pulling down the low-side potential node VSXB to a first voltage level. Meanwhile, the second electrical path 220 is open during the first period due to the deactivation of the second switch 225. At the end of the first period, the first control signal 215 is set to logic 0 to deactivate the first switch 210, thereby decoupling the low-side potential node VSXB from the negative charge pump 124. For one embodiment, the first period is defined as a time necessary to pull down the voltage level of the input 285 to a first voltage level between about −1V and −2V. For another embodiment, the first period is defined as a time necessary to pull down the input 285 to a first voltage level between about −1.5V and −2V.

During a first phase of a second period of the erase operation, with both the first switch 210 and the second switch 225 deactivated, the gates of the fourth switch 260 and the fifth switch 265 detect the condition of the low-side potential node VSXB. Note that the gates of the fourth switch 260 and the fifth switch 265 are exposed to the condition of the low-side potential node VSXB during the first period as well. However, the condition during the first period is generally inconsequential.

Because the low-side potential node VSXB is coupled to one or more word lines 102 of the memory block 100 through associated word line drivers 120 during an erase operation, if one of the coupled word lines 102 is shorted to a floating bit line 104, the low-side potential node VSXB will experience an unacceptably high current leakage to the shorted, i.e., defective, word line 102. As such, the low-side potential node VSXB may equilibrate at an unacceptably high voltage level either before or after decoupling the negative charge pump 124 from the low-side potential node VSXB at the end of the first period. In one scenario, if the current leakage of the defective word line 102 is less than the capacity of the negative charge pump 124, the potential of the low-side potential node VSXB will continue to pull down while coupled to the negative charge pump 124. In another scenario, the current leakage of a defective word line 102 may potentially outpace the capacity of a negative charge pump 124 such that the potential of the low-side potential node VSXB will equilibrate at some level while still coupled to the active negative charge pump 124, i.e., the voltage level where the current leakage of the defective word line 102 equals the capacity of the negative charge pump 124. In either scenario, however, the potential of the defective word line 102 and, therefore, the low-side potential node VSXB, will begin to rise toward a ground potential upon decoupling the negative charge pump 124 from the low-side potential node VSXB.

If the low-side potential node VSXB is not coupled to any shorted word lines 102, its voltage level will generally remain stable at a first voltage level during the first phase of the second period. In the case of a shorted word line 102, the voltage level of the low-side potential node VSXB will generally rise to or equilibrate at some second voltage level during the first phase of the second period. If the second voltage level is above the trip point of the inverter circuit (made up of the fourth switch 260 and the fifth switch 265), the inverter circuit will provide a feedback control signal having a first state, i.e., the voltage level of the input 285, to the third switch 235. If the voltage level of the low-side potential node VSXB remains stable at the first voltage level, or rises to a level below the trip point of the inverter circuit, the inverter circuit provides a feedback control signal having a second state, i.e., the voltage level of the potential node 270, to the third switch 235. The trip point of the inverter circuit should be chosen such that voltage levels of the low-side potential node VSXB equal to or above the trip point are indicative of a shorted word line 102. The feedback control signal having the first state applied to the third switch 235 serves to deactivate the third switch 235, thus presenting an open circuit across the third switch 235. The feedback control signal having the second state applied to the third switch 235 serves to activate the third switch 235, thus presenting a closed circuit across the third switch 235.

The length of the first phase of the second period should generally be long enough to permit a sufficient voltage rise in response to a shorted word line 102 for easy flipping of the inverter circuit to present a fully-developed logic state at its output 280. At the trip point, the conductance of the fourth switch 260 will begin to exceed the conductance of the fifth switch 265, but the logic level developed at the output 280 may not be sufficient to fully deactivate the third switch 235 until the conductance of the fourth switch 260 substantially exceeds the conductance of the fifth switch 265. Partial activation of the third switch 235 during the subsequent phase of the second period may detrimentally restore coupling between the negative charge pump 124 and a defective word line 102.

For one embodiment, the negative charge pump 124 remains active during the first phase of the second period such that it continues to pull down on the input 285 of the negative switch circuit 200c. As such, timing of the first phase of the second period becomes especially important. With the fourth switch 260 back-biased to the input 285, the trip point of the inverter circuit will drift downward during the first phase of the second period as the voltage level of the input 285 becomes more negative. Although the first phase of the second period should extend a sufficient amount of time to permit easy flipping of the inverter circuit, it should not extend to a point when the trip point of the inverter circuit is at or below the first voltage level. If the trip point of the inverter circuit were permitted to fall to a level at or below the first voltage level, the output 280 of the inverter circuit would be indicative of a defective word line 102 regardless of whether any coupled word lines 102 were in fact defective. For one embodiment, the first phase of the second period extends for approximately 1 μs.

In a second phase of the second period, the second switch 225 is activated in response to a logic 1 level of the second control signal 230. If the third switch 235 is activated at this time in response to output 280, the negative potential node 285 and the word lines 102 will be coupled through the second electrical path 220 to permit erasure of the associated memory cells 106. If the third switch 235 is deactivated, the negative potential node 285 and the associated word lines 102 will be decoupled. Accordingly, the negative switch circuit 200c decouples the negative potential node 285 from the low-side potential node VSXB upon detecting an indication of a defect associated with the low-side potential node VSXB, while permitting coupling of the negative potential node 285 and the low-side potential node VSXB if no indication of a defect is detected.

Figure 3:
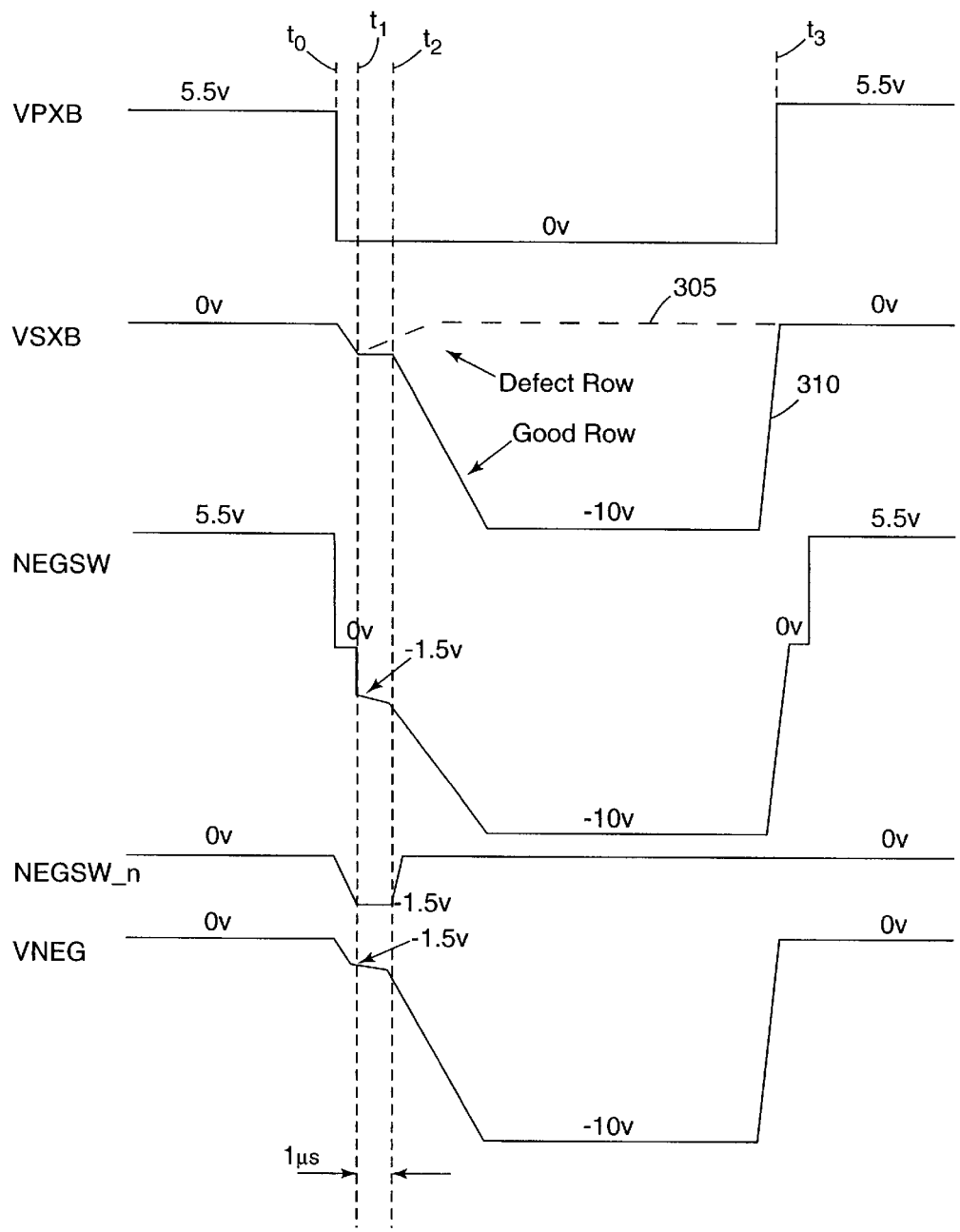
FIG. 3. is a signal diagram in accordance with another embodiment of the invention.

FIG. 3 is a signal diagram for one embodiment of a negative switch circuit 200c showing the signal values in a flash memory device going from a wait state to an erase operation and back to a wait state. Prior to time $t_0$, the memory device is in a wait state. At time $t_0$, the device begins the first period of the erase operation. At the beginning of the first period, the high-side potential node VPXB is brought from 5.5V to a ground potential, the first control signal NEGSW is brought from 5.5V (logic 1) to a ground potential, and the second control signal NEGSW_n and the low-side potential node VSXB are allowed to follow the negative potential node VNEG. Note that although the first control signal NEGSW is brought from 5.5V to a ground potential, it remains at logic 1; due to signal decay of the first control signal NEGSW and the increasingly negative back-bias of the negative potential node VNEG, the first control signal NEGSW will remain above the gate potential necessary to activate its associated nFET.

At time $t_1$, the first period of the erase operation ends and the first phase of the second period begins. Time $t_1$ is the time at which the negative potential node VNEG reaches −1.5V. At the beginning of the first phase of the second period, the first control signal NEGSW is brought to −1.5V to deactivate its associated nFET and the second control signal NEGSW_n is maintained at −1.5V to maintain deactivation of its associated nFET. The first phase of the second period is held from time $t_1$ to time $t_2$ which, in this embodiment, is a delta of 1 μs. If the negative switch circuit 200c is coupled to a shorted word line 102, the signal of the low-side potential node VSXB may be represented by the dashed trace 305, showing an equilibration toward ground upon decoupling the negative charge pump 124. If the word lines 102 coupled to the negative switch circuit 200c are not shorted, the signal of the low-side potential node VSXB may be represented by the solid trace 310.

For one embodiment, as shown in FIG. 3, the negative potential node VNEG alters its slope at time ti to have a reduced magnitude. Because the nFET devices associated with the control signals NEGSW and NEGSW_n are deactivated during this time, there is no load on the negative potential node VNEG. Furthermore, there is no need to pull down the negative potential node VNEG any further during this first phase of the second period; even maintaining a constant potential level on the negative potential node VNEG during the first phase of the second period is sufficient to maintain deactivation of the nFET devices and to provide for subsequent detection of a defect row. In addition, reducing the magnitude of the slope of the negative potential node VNEG during this time reduces the risk of moving the trip point of the feedback controller below the level of the low-side potential node VSXB for a good row, e.g., trace 310. Accordingly, reducing the magnitude of the slope of the negative potential node VNEG during the first phase of the second period permits extending the time delta of this phase to facilitate detection of less severe shorts. Reducing the magnitude of the slope of the negative potential node VNEG can be accomplished, for example, by reducing a frequency of the negative charge pump 124 during the first phase of the second period.

At time $t_2$, the second control signal NEGSW_n is brought back to a ground potential for the start of the second phase of the second period of the erase operation while the first control signal NEGSW is allowed to follow the negative potential node VNEG to remain in a logic 0 state. Given the back-bias of the negative potential node VNEG, the ground potential of the second control signal NEGSW_n represents a logic 1 state, thus activating its associated nFET. If the negative switch circuit 200c is coupled to a shorted word line 102, the negative charge pump 124 will remain decoupled from the low-side potential node VSXB such that it will continue to equilibrate toward a ground potential as shown by the dashed trace 305. If the word lines 102 coupled to the negative switch circuit 200c are not shorted, the low-side potential node VSXB will again be coupled to the negative charge pump 124 and will again follow the negative potential node VNEG as shown by the solid trace 310. For one embodiment, the slope of the negative potential node VNEG is increased in magnitude at the start of the second phase of the second period. Increasing the magnitude of the slope of the negative potential node VNEG at this time facilitates faster erase operations by permitting the node to more quickly reach its desired potential.

At time $t_3$, the erase operation is complete. At this point, the high-side potential node VPXB is brought back to 5.5V, the first control signal NEGSW is brought back to 5.5V, the negative potential node VNEG is brought back to a ground potential and the low-side potential node VSXB is allowed to follow the negative potential node VNEG through the first electrical path 205 of the negative switch circuit 200c.

Figure 4:
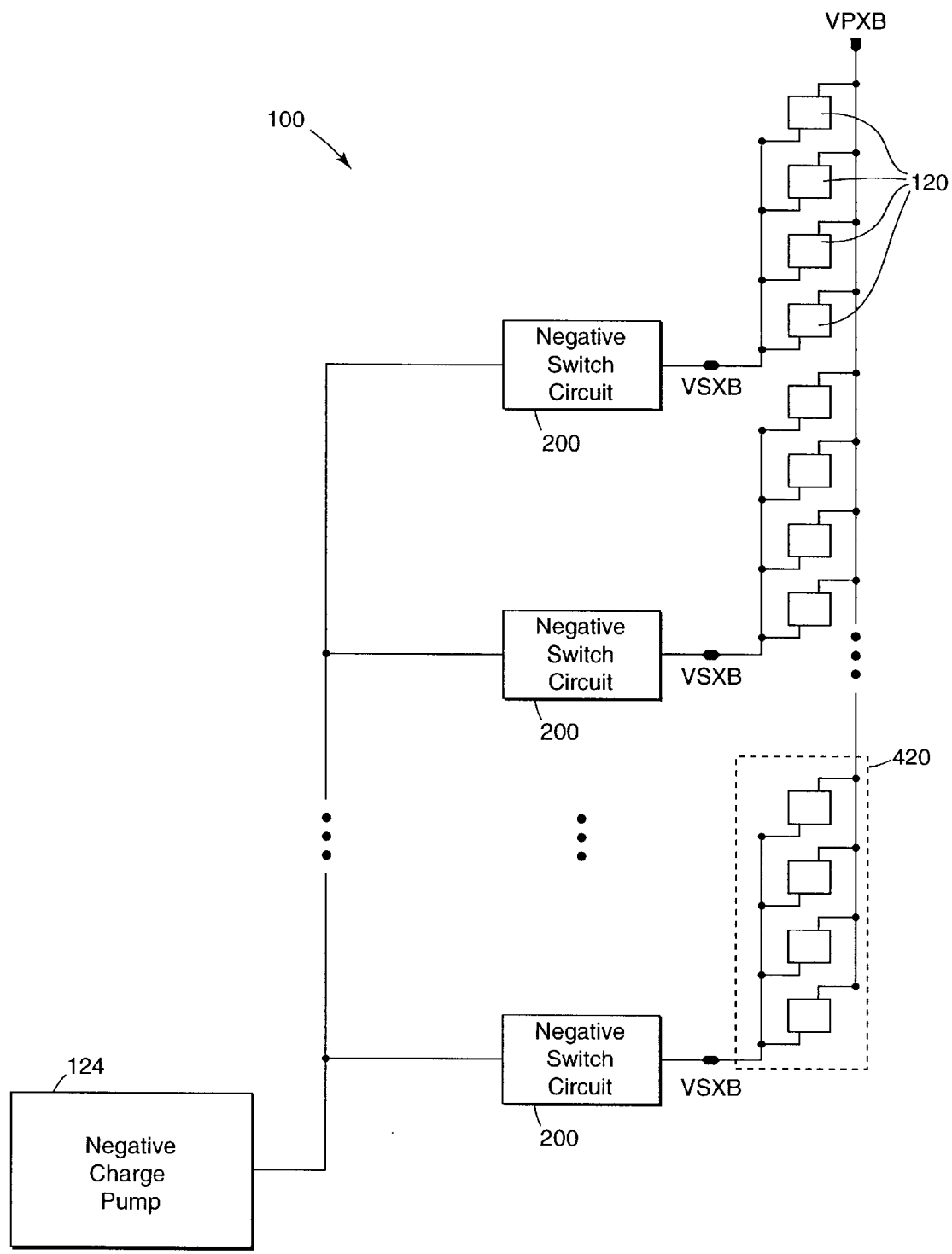
FIG. 4 is a schematic of a portion of a memory block in accordance with another embodiment of the invention.

FIG. 4 is a schematic of a portion of a memory block 100 showing that one negative charge pump 124 may be coupled to multiple negative switch circuits 200 within a memory block 100. Each negative switch circuit 200 is coupled to a low-side potential node VSXB for a group 420 of word line drivers 120. Each group 420 may contain one or more word line drivers 120. For one embodiment, each group 420 contains four word line drivers 120. As shown in FIG. 4, each group 420 may share a common high-side potential node VPXB, although each group 420 has a separate low-side potential node VSXB. In this configuration, a shorted word line 102 associated with one group 420 will not affect erase operations in other groups 420; the negative switch circuit 200 associated with the defective group 420 will decouple the negative charge pump 124 from the defective group 420 as previously described while the remaining negative switch circuits 200 will permit coupling of the negative charge pump 124 to their associated groups 420, word line drivers 120 and word lines 102 (not shown in FIG. 4).

Memory blocks 100 in accordance with the various embodiments of the invention find use in non-volatile memory devices as previously described. One particular non-volatile memory device in accordance with the invention is shown in FIG. 5.

Figure 5:
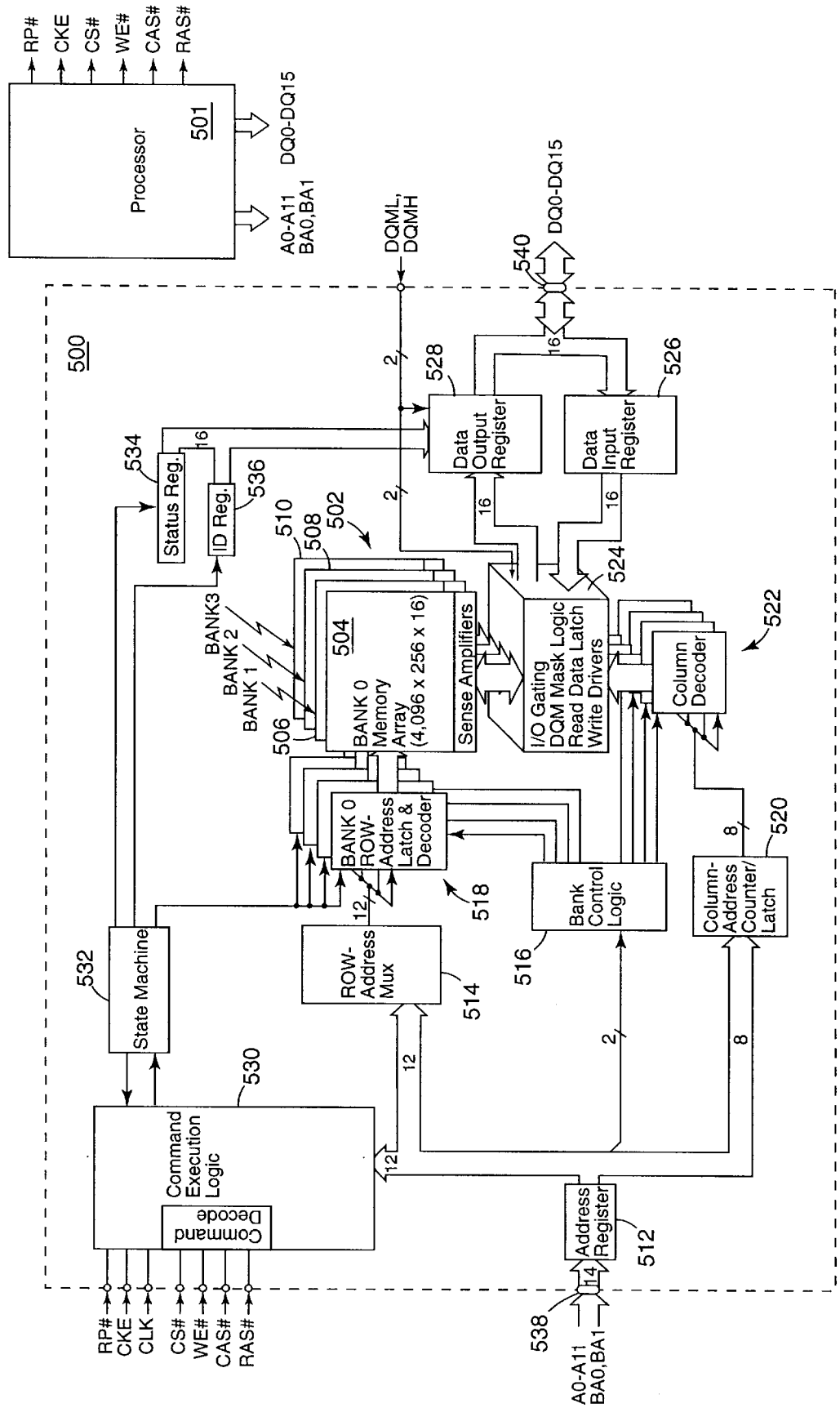
FIG. 5 is a block diagram of a memory device in accordance with the invention.

FIG. 5 is a block diagram of one embodiment of a synchronous memory device in accordance with the invention. The memory device 500 includes an array of non-volatile flash memory cells 502 having at least one memory block having a negative switch circuit as described herein. All access commands to the array 502 of the memory device 500 are synchronized to a system clock input signal (CLK), thus the memory device 500 may be referred to as a synchronous flash memory device or synchronous non-volatile memory device.

The array 502 is arranged in a plurality of addressable banks. In one embodiment, the memory contains four memory banks 504, 506, 508 and 510. Each memory bank contains addressable sectors of memory cells. The data stored in the memory can be accessed using externally provided location addresses received by address register 512 through a plurality of address inputs 538. The externally provided location addresses may be provided by a processor 501 of an electronic system as is known in the art. The addresses are decoded using row address multiplexer circuitry 514. The addresses are also decoded using bank control logic 516 and row address latch and decode circuitry 518. To access an appropriate column of the memory, column address counter and latch circuitry 520 couples the received addresses to column decode circuitry 522. Circuit 524 provides input/output (I/O) gating, data mask logic, read data latch circuitry and write driver circuitry. Data is input through data input registers 526 and output through data output registers 528 using a plurality of data inputs/outputs 540, which are generally coupled to the processor 501 of an electronic system. Command execution logic 530 is provided to generate commands to control the basic operations performed on the memory banks of the memory device. A state machine 532 is also provided to control specific operations performed on the memory array. A status register 534 and an identification register 536 can also be provided to output data. The command circuit 530 and/or state machine 532 can be generally referred to as control circuitry to control read, write, erase and other memory operations. As is known in the art, integrated circuit memory devices of the type described with reference to FIG. 5 may be fabricated on a substrate, such as a semiconductor wafer, and may be referred to as a memory chip.

Memory devices in accordance with the invention may further be assembled in a package having interconnects for receiving power inputs, clock and control signal inputs and address inputs, and for providing data I/O between the memory device and external devices.

FIG. 6A illustrates an interconnect pin assignment of one embodiment of the present invention as a memory assembly having a pin layout substantially similar to an industry-standard SDRAM 54-pin TSOP (thin small-outline package) package. Accordingly, the memory assembly has a memory package 650 having 54 interconnect pins and a memory device (not shown in FIG. 6A) in accordance with the invention. The memory device is contained in the memory package 650. The address inputs, data inputs/outputs, power inputs and clock and control signal inputs of the memory device are coupled to the interconnect pins of the memory package 650 in a conventional manner. Two interconnects shown in the embodiment of FIG. 6A and not present in standard SDRAM packages include control signal RP# and power input VccP. Although knowledge of the function of the various clock and control signals and the various power inputs is not essential to understanding the present invention, a detailed discussion is included in U.S. patent application Ser. No. 09/567,733 filed May 10, 2000 and titled, "Flash with Consistent Latency," which is commonly assigned.

Figure 6B:
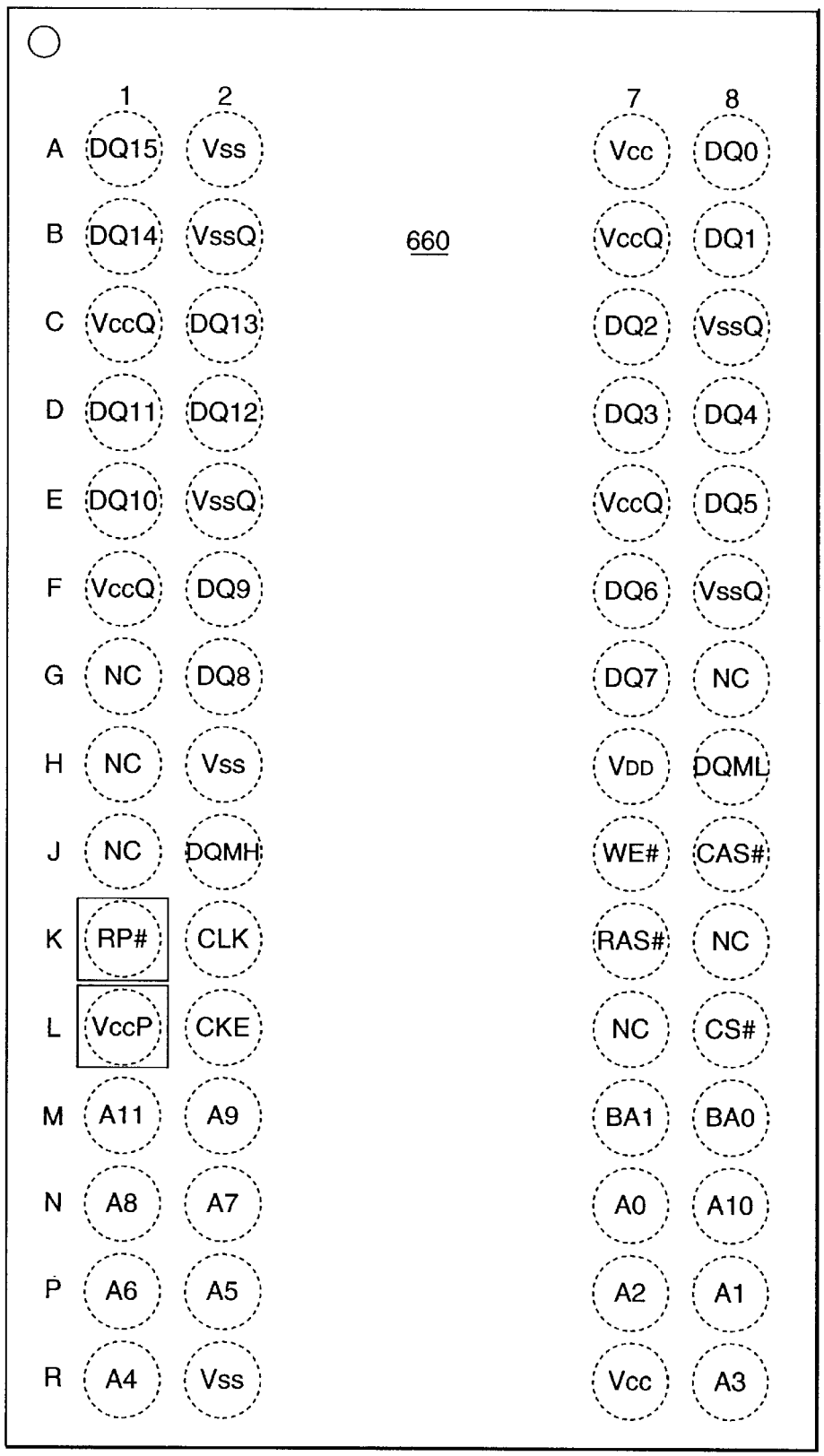
FIG. 6B is a top view of a memory assembly showing a package bump assignment diagram in accordance with the invention.

FIG. 6B illustrates a bump assignment of one embodiment of the present invention as a memory assembly having a bump layout substantially similar to an industry-standard SDRAM 60-bump FBGA (fine-pitch ball grid array) package. Memory package 660 is generally similar to memory package 650 except that the interconnects of memory package 660 have bump connections instead of the pin connections of memory package 650. The present invention, therefore, is not limited to a specific package configuration. Furthermore, the invention is not limited to memory packages having pin or bump layouts substantially similar to the interconnect layout of an industry-standard SDRAM package, but is applicable to other memory packages having memory devices containing negative switch circuits in accordance with the various embodiments of the invention.

CONCLUSION

Erase operations in non-volatile memory devices are often carried out in blocks rather than individual cells. Such block erase operations generally apply a negative erase voltage from a negative potential node to each word line of the memory block. If a word line is shorted to a bit line, the negative erase voltage may be incapable of reaching the levels necessary to achieve erasure of the memory block. With the inability to effectively erase an entire block of memory cells, the memory device may be commercially unacceptable. Various embodiments described herein utilize a current limiting negative switch circuit to decouple a defective portion of a memory block, i.e., a portion containing such a shorted word line, from the negative potential node while permitting coupling of at least a portion of the remaining, non-defective word lines to the negative potential node.

Negative switch circuits as described herein are arranged to have a first electrical path coupled between an input and an output of the negative switch circuit and a second electrical path in parallel with the first electrical path for selectively isolating a load at the output of the negative switch circuit from a negative potential node at the input of the negative switch circuit. The first electrical path presents an open circuit in response to a first state of a first control signal and presents a closed circuit in response to a second state of the first control signal. The second electrical path presents an open circuit in response to either a first state of a second control signal or a condition of the load indicative of a defect associated with the load, and presents a closed circuit in response to a second state of the second control signal in combination with a condition of the load not indicative of such a defect. Such negative switch circuits are adaptable to isolate defective portions of a memory device from a negative charge pump during block erase operations. In operation, the negative switch circuit isolates the input of the negative switch circuit from the output of the negative switch circuit if a detected condition of the output of the negative switch circuit is indicative of a defect while permitting coupling of the input of the negative switch circuit to the output of the negative switch circuit if the detected condition of the output of the negative switch circuit is not indicative of a defect.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A negative switch circuit, comprising:
   a first electrical path coupled between an input and an output of the negative switch circuit and having a first switch coupled to receive a first control signal;
   a second electrical path in parallel with the first electrical path and having a second switch and a third switch coupled in series, wherein the second switch is coupled to receive a second control signal; and
   a feedback controller having an input coupled to the output of the negative switch circuit;
   wherein the third switch is coupled to receive a feedback control signal from an output of the feedback controller.

2. The negative switch circuit of claim 1, wherein the first switch, the second switch and the third switch are each an n-channel field-effect transistor.

3. The negative switch circuit of claim 2, wherein the first switch, the second switch and the third switch are each back-biased to the input of the negative switch circuit.

4. A negative switch circuit, comprising:
   a first electrical path coupled between an input and an output of the negative switch circuit and having a first switch coupled to receive a first control signal;
   a second electrical path in parallel with the first electrical path and having a second switch and a third switch coupled in series, wherein the second switch is coupled to receive a second control signal; and
   an inverter circuit supplied by a first potential node and a second potential node, wherein the inverter circuit has an input coupled to the output of the negative switch circuit for detecting a condition of the output of the negative switch circuit and wherein the inverter circuit has an output for providing a feedback control signal in response to a detected condition of the output of the negative switch circuit;
   wherein the third switch is coupled to receive the feedback control signal.

5. The negative switch circuit of claim 4, wherein the first switch, the second switch and the third switch are each an n-channel field-effect transistor.

6. The negative switch circuit of claim 5, wherein the first switch, the second switch and the third switch are each back-biased to the input of the negative switch circuit.

7. The negative switch circuit of claim 4, wherein the first potential node is a negative potential node and the second potential node is a ground potential node.

8. The negative switch circuit of claim 7, wherein the negative potential node is the input of the negative switch circuit.

9. The negative switch circuit of claim 4, wherein the inverter circuit comprises:
   an n-channel field-effect transistor having a gate, a source and a drain; and
   a p-channel field-effect transistor having a gate, a source and a drain;
   wherein the source of the n-channel field-effect transistor is coupled to the first potential node, the source of the p-channel field-effect transistor is coupled to the second potential node, the gates of both transistors are coupled to the input of the inverter circuit, and the drains of both transistors are coupled to the output of the inverter circuit.

10. A negative switch circuit, comprising:
    a first electrical path coupled between an input and an output of the negative switch circuit; and
    a second electrical path coupled in parallel with the first electrical path;
    wherein the first electrical path is adapted to present an open circuit between the input and the output of the negative switch circuit in response to a first state of a first control signal and to present a closed circuit between the input and the output of the negative switch circuit in response to a second state of the first control signal;
    wherein the second electrical path is adapted to present an open circuit between the input and the output of the negative switch circuit in response to a first state of a second control signal and to permit a closed circuit between the input and the output of the negative switch circuit in response to a second state of the second control signal; and
    wherein the second electrical path is further adapted to present an open circuit between the input and the output of the negative switch circuit in response to a first state of a feedback control signal regardless of the state of the second control signal and to permit a closed circuit between the input and the output of the negative switch circuit in response to a second state of the feedback control signal when the second control signal is in the second state.

11. The negative switch circuit of claim 10, wherein the feedback control signal is indicative of a condition of the output of the negative switch circuit.

12. The negative switch circuit of claim 10, wherein the first electrical path comprises a first n-channel field-effect transistor coupled between the input and the output of the negative switch circuit and having a gate coupled to receive the first control signal.

13. The negative switch circuit of claim 12, wherein the second electrical path comprises a second n-channel field-effect transistor and a third n-channel field-effect transistor coupled in series between the input and the output of the negative switch circuit, wherein the second n-channel field-effect transistor has a gate coupled to receive the second control signal, and wherein the third n-channel field-effect transistor has a gate coupled to receive the feedback control signal.

14. The negative switch circuit of claim 13, further comprising an inverter circuit having an input coupled to the output of the negative switch circuit and an output coupled to the gate of the third n-channel field-effect transistor for providing the feedback control signal.

15. A negative switch circuit, comprising:
a first n-channel field-effect transistor having a gate coupled to receive a first control signal, a source coupled to an input of the negative switch circuit, a drain coupled to an output of the negative switch circuit, and a body coupled to the input of the negative switch circuit;
a second n-channel field-effect transistor having a gate coupled to receive a second control signal, a source coupled to the input of the negative switch circuit, a drain, and a body coupled to the input of the negative switch circuit;
a third n-channel field-effect transistor having a gate, a source coupled to the drain of the second n-channel field-effect transistor, a drain coupled to the output of the negative switch circuit, and a body coupled to the input of the negative switch circuit;
a fourth n-channel field-effect transistor having a gate coupled to the output of the negative switch circuit, a source coupled to the input of the negative switch circuit, a drain coupled to the gate of the third n-channel field-effect transistor, and a body coupled to the input of the negative switch circuit; and
a first p-channel field-effect transistor having a gate coupled to the output of the negative switch circuit, a source coupled to a first potential node, a drain coupled to the gate of the third n-channel field-effect transistor, and a body coupled to the first potential node.

16. A negative switch circuit, comprising:
a first electrical path coupled between an input and an output of the negative switch circuit, wherein the first electrical path presents an open circuit in response to a first state of a first control signal, and wherein the first electrical path presents a closed circuit in response to a second state of the first control signal; and
a second electrical path coupled in parallel with the first electrical path, wherein the second electrical path presents an open circuit in response to either a first state of a second control signal or a voltage level of the output of the negative switch circuit equal to or above a trip point, and wherein the second electrical path presents a closed circuit in response to a second state of the second control signal and a voltage level of the output of the negative switch circuit below the trip point.

17. A method of selectively coupling a negative potential node to a load, comprising:
coupling the negative potential node to the load during a first period, thereby pulling a potential of the load to a first voltage level;
decoupling the negative potential node from the load during a first phase of a second period;
detecting a voltage level of the load during the first phase of the second period;
coupling the negative potential node to the load during a second phase of the second period if the detected voltage level of the load during the second phase of the second period is between the first voltage level and a trip point; and
leaving the negative potential node decoupled from the load during the second phase of the second period if the detected voltage level of the load during the second phase of the second period is equal to or above the trip point.

18. The method of claim 17, wherein the first period is a period of time necessary to pull the load down to the first voltage level.

19. The method of claim 18, wherein the first voltage level is between approximately −1V to −2V.

20. The method of claim 18, wherein the first voltage level is approximately −1.5V.

21. The method of claim 17, wherein the first phase of the second period is a predetermined period of time.

22. The method of claim 21, wherein the predetermined period of time is approximately 1 $\mu$s.

23. The method of claim 17, wherein a detected voltage level of the load during the second phase of the second period equal to or above a trip point is indicative of a defect associated with the load.

24. The method of claim 17, further comprising altering a slope of the negative potential node during the first phase of the second period.

25. A method of selectively coupling a negative potential node to a load, comprising:
coupling the negative potential node to the load during a first period, thereby pulling a potential of the load to a first voltage level;
decoupling the negative potential node from the load during a first phase of a second period;
detecting a voltage level of the load during the first phase of the second period;
coupling the negative potential node to the load during a second phase of the second period if the detected voltage level of the load during the second phase of the second period is indicative of an electrically floating load during the first phase of the second period; and
leaving the negative potential node decoupled from the load during the second phase of the second period if the detected voltage level of the load during the second phase of the second period is indicative of an electrically shorted load during the first phase of the second period.

26. A method of selectively coupling a negative potential node to a load, comprising:
coupling the negative potential node to the load during a first period;
pulling the load down to a first voltage level during the first period, wherein the first voltage level is between about −1V to −2V;
decoupling the negative potential node from the load during a first phase of a second period;
detecting a voltage level of the load during the first phase of the second period;
coupling the negative potential node to the load during a second phase of the second period if the detected voltage level of the load during the second phase of the second period is indicative of an electrically floating load; and
leaving the negative potential node decoupled from the load during the second phase of the second period if the detected voltage level of the load during the second phase of the second period is indicative of an electrically shorted load.

27. The method of claim 26, wherein the first phase of the second period is a predetermined period of time.

28. The method of claim 27, wherein the predetermined period of time is approximately 1 $\mu$s.

29. The method of claim 26, wherein the negative potential node is an output of a negative charge pump.

30. The method of claim 29, wherein the negative charge pump remains active during the first phase of the second period.

31. The method of claim 29, wherein a frequency of the negative charge pump is reduced during the first phase of the second period.

32. A method of erasing at least a portion of a block of non-volatile memory cells, comprising:
- activating a plurality of word line drivers of the block of non-volatile memory cells, wherein each word line driver is supplied by a high-side potential node and a low-side potential node and has an output coupled to a word line, and wherein each word line is coupled to at least one memory cell of the block of non-volatile memory cells;
- coupling each low-side potential node to a negative potential node during a first period, thereby pulling each low-side potential node down to a first voltage level;
- decoupling each low-side potential node from the negative potential node during a first phase of a second period, thereby permitting each word line associated with one of the plurality of word line drivers to electrically float;
- detecting a voltage level of each low-side potential node, wherein a voltage level equal to or above a trip point is indicative of an electrical short associated with the low-side potential node and a voltage level below the trip point is indicative of electrically floating word lines;
- coupling each low-side potential node having a voltage level indicative of electrically floating word lines to the negative potential node, thereby producing coupled low-side potential nodes;
- leaving each low-side potential node having a voltage level indicative of an electrical short decoupled from the negative potential node, thereby producing decoupled low-side potential nodes; and
- pulling each coupled low-side potential node down to an erase voltage, thereby erasing memory cells of the block of non-volatile memory cells associated with the coupled low-side potential nodes.

33. The method of claim 32, wherein the first phase of the second period is a predetermined period of time.

34. The method of claim 33, wherein the predetermined period of time is approximately 1 µs.

35. The method of claim 32, wherein the negative potential node is an output of a negative charge pump.

36. The method of claim 35, wherein the negative charge pump remains active during the first phase of the second period.

37. A non-volatile memory device, comprising:
- an array of non-volatile memory cells arranged in addressable rows and columns;
- a plurality of word lines, wherein each word line is coupled to a row of memory cells;
- at least one high-side potential node;
- at least one low-side potential node;
- a plurality of word line drivers, wherein each word line driver is associated with a word line, and wherein each word line driver has a high side coupled to a high-side potential node and a low side coupled to a low-side potential node;
- at least one negative charge pump; and
- at least one negative switch circuit, wherein a negative switch circuit is coupled between each low-side potential node and an output of a negative charge pump, and wherein each negative switch circuit comprises:
  - a first electrical path coupled between the output of the negative charge pump associated with the negative switch circuit and the low-side potential node associated with the negative switch circuit, wherein the first electrical path has a first switch coupled to receive a first control signal;
  - a second electrical path in parallel with the first electrical path and having a second switch and a third switch coupled in series, wherein the second switch is coupled to receive a second control signal; and
  - a feedback controller having an input coupled to the low-side potential node associated with the negative switch circuit;
  - wherein the third switch is coupled to receive a feedback control signal from an output of the feedback controller.

38. A non-volatile memory device, comprising:
- an array of non-volatile memory cells arranged in addressable rows and columns;
- a plurality of word lines, wherein each word line is coupled to a row of memory cells;
- at least one high-side potential node;
- at least one low-side potential node;
- a plurality of word line drivers, wherein each word line driver is associated with a word line, and wherein each word line driver has a high side coupled to a high-side potential node and a low side coupled to a low-side potential node;
- at least one negative charge pump; and
- at least one negative switch circuit, wherein a negative switch circuit is coupled between each low-side potential node and an output of a negative charge pump, and wherein each negative switch circuit comprises:
  - a first electrical path coupled between the output of the negative charge pump associated with the negative switch circuit and the low-side potential node associated with the negative switch circuit, wherein the first electrical path has a first switch coupled to receive a first control signal;
  - a second electrical path in parallel with the first electrical path and having a second switch and a third switch coupled in series, wherein the second switch is coupled to receive a second control signal; and
  - an inverter circuit supplied by a high-side potential node and the low-side potential node associated with the negative switch circuit, wherein the inverter circuit has an input coupled to the low-side potential node for detecting a condition of the low-side potential node and wherein the inverter circuit has an output for providing a feedback control signal in response to a detected condition of the low-side potential node;
  - wherein the third switch is coupled to receive the feedback control signal.

39. The non-volatile memory device of claim 38, wherein the first switch, the second switch and the third switch of each negative switch circuit are each an n-channel field-effect transistor.

40. The non-volatile memory device of claim 39, wherein the first switch, the second switch and the third switch of each negative switch circuit are each back-biased to the output of the negative charge pump associated with the negative switch circuit.

41. The non-volatile memory device of claim 38, wherein each high-side potential node is a ground potential node.

42. The non-volatile memory device of claim 38, wherein the inverter circuit comprises:
   an n-channel field-effect transistor having a gate, a source and a drain; and
   a p-channel field-effect transistor having a gate, a source and a drain;
   wherein the source of the n-channel field-effect transistor is coupled to the output of the negative charge pump associated with the negative switch circuit, the source of the p-channel field-effect transistor is coupled to the high-side potential node associated with the negative switch circuit, the gates of both transistors are coupled to the input of the inverter circuit, and the drains of both transistors are coupled to the output of the inverter circuit.

43. A non-volatile memory device, comprising:
   an array of non-volatile memory cells arranged in addressable rows and columns;
   a plurality of word lines, wherein each word line is coupled to a row of memory cells;
   at least one high-side potential node;
   at least one low-side potential node;
   a plurality of word line drivers, wherein each word line driver is associated with a word line, and wherein each word line driver has a high side coupled to a high-side potential node and a low side coupled to a low-side potential node;
   at least one negative charge pump; and
   at least one negative switch circuit, wherein a negative switch circuit is coupled between each low-side potential node and an output of a negative charge pump, and wherein each negative switch circuit comprises:
      a first electrical path coupled between the output of the negative charge pump associated with the negative switch circuit and the low-side potential node associated with the negative switch circuit; and
      a second electrical path coupled in parallel with the first electrical path;
      wherein the first electrical path is adapted to present an open circuit between the output of the negative charge pump associated with the negative switch circuit and the low-side potential node associated with the negative switch circuit in response to a first state of a first control signal and to present a closed circuit between the output of the negative charge pump associated with the negative switch circuit and the low-side potential node associated with the negative switch circuit in response to a second state of the first control signal;
      wherein the second electrical path is adapted to present an open circuit between the output of the negative charge pump associated with the negative switch circuit and the low-side potential node associated with the negative switch circuit in response to a first state of a second control signal and to permit a closed circuit between the output of the negative charge pump associated with the negative switch circuit and the low-side potential node associated with the negative switch circuit in response to a second state of the second control signal; and
      wherein the second electrical path is further adapted to present an open circuit between the output of the negative charge pump associated with the negative switch circuit and the low-side potential node associated with the negative switch circuit in response to a first state of a feedback control signal regardless of the state of the second control signal and to permit a closed circuit between the output of the negative charge pump associated with the negative switch circuit and the low-side potential node associated with the negative switch circuit in response to a second state of the feedback control signal when the second control signal is in the second state.

44. A non-volatile memory device, comprising:
   an array of non-volatile memory cells arranged in addressable rows and columns;
   a plurality of word lines, wherein each word line is coupled to a row of memory cells;
   at least one high-side potential node;
   at least one low-side potential node;
   a plurality of word line drivers, wherein each word line driver is associated with a word line, and wherein each word line driver has a high side coupled to a high-side potential node and a low side coupled to a low-side potential node;
   at least one negative charge pump; and
   at least one negative switch circuit, wherein a negative switch circuit is coupled between each low-side potential node and an output of a negative charge pump, and wherein each negative switch circuit comprises:
      a first n-channel field-effect transistor having a gate coupled to receive a first control signal, a source coupled to the output of the negative charge pump associated with the negative switch circuit, a drain coupled to the low-side potential node associated with the negative switch circuit, and a body coupled to the output of the negative charge pump associated with the negative switch circuit;
      a second n-channel field-effect transistor having a gate coupled to receive a second control signal, a source coupled to the output of the negative charge pump associated with the negative switch circuit, a drain, and a body coupled to the output of the negative charge pump associated with the negative switch circuit;
      a third n-channel field-effect transistor having a gate, a source coupled to the drain of the second n-channel field-effect transistor, a drain coupled to the low-side potential node associated with the negative switch circuit, and a body coupled to the output of the negative charge pump associated with the negative switch circuit;
      a fourth n-channel field-effect transistor having a gate coupled to the low-side potential node associated with the negative switch circuit, a source coupled to the output of the negative charge pump associated with the negative switch circuit, a drain coupled to the gate of the third n-channel field-effect transistor, and a body coupled to the output of the negative charge pump associated with the negative switch circuit; and
      a first p-channel field-effect transistor having a gate coupled to the low-side potential node associated with the negative switch circuit, a source coupled to a high-side potential node, a drain coupled to the gate of the third n-channel field-effect transistor, and a body coupled to the high-side potential node.

45. A synchronous flash memory device, comprising:
   an array of non-volatile flash memory cells arranged in addressable rows and columns;
   a command execution logic for receiving at least a system clock input signal, for generating an internal clock signal in response to the system clock input signal, and for generating control signals to control operations performed on the array of non-volatile flash memory cells synchronized to the internal clock signal;

at least one word line, wherein each word line is coupled to a row of memory cells;

at least one high-side potential node;

at least one low-side potential node;

at least one word line driver, wherein each word line driver is associated with a word line, and wherein each word line driver has a high side coupled to a high-side potential node and a low side coupled to a low-side potential node;

at least one negative charge pump; and at least one negative switch circuit, wherein a negative switch circuit is coupled between each low-side potential node and an output of a negative charge pump, and wherein each negative switch circuit comprises:
  a first electrical path coupled between negative charge pump associated with the negative switch circuit and the low-side potential node associated with the negative switch circuit, wherein the first electrical path presents an open circuit in response to a first state of a first control signal, and wherein the first electrical path presents a closed circuit in response to a second state of the first control signal; and
  a second electrical path coupled in parallel with the first electrical path, wherein the second electrical path presents an open circuit in response to either a first state of a second control signal or a voltage level of the low-side potential node associated with the negative switch circuit equal to or above a trip point, and wherein the second electrical path presents a closed circuit in response to a second state of the second control signal and a voltage level of the low-side potential node associated with the negative switch circuit below the trip point.

46. A synchronous flash memory device, comprising:

an array of non-volatile flash memory cells arranged in addressable rows and columns;

a command execution logic for receiving at least a system clock input signal, for generating an internal clock signal in response to the system clock input signal, and for generating control signals to control operations performed on the array of non-volatile flash memory cells synchronized to the internal clock signal;

at least one word line, wherein each word line is coupled to a row of memory cells;

at least one high-side potential node;

at least one low-side potential node;

at least one word line driver, wherein each word line driver is associated with a word line, and wherein each word line driver has a high side coupled to a high-side potential node and a low side coupled to a low-side potential node;

at least one negative charge pump; and at least one negative switch circuit, wherein a negative switch circuit is coupled between each low-side potential node and an output of a negative charge pump, and wherein each negative switch circuit comprises:
  a first n-channel field-effect transistor having a gate coupled to receive a first control signal, a source coupled to the output of the negative charge pump associated with the negative switch circuit, a drain coupled to the low-side potential node associated with the negative switch circuit, and a body coupled to the output of the negative charge pump associated with the negative switch circuit;
  a second n-channel field-effect transistor having a gate coupled to receive a second control signal, a source coupled to the output of the negative charge pump associated with the negative switch circuit, a drain, and a body coupled to the output of the negative charge pump associated with the negative switch circuit;
  a third n-channel field-effect transistor having a gate, a source coupled to the drain of the second n-channel field-effect transistor, a drain coupled to the low-side potential node associated with the negative switch circuit, and a body coupled to the output of the negative charge pump associated with the negative switch circuit;
  a fourth n-channel field-effect transistor having a gate coupled to the low-side potential node associated with the negative switch circuit, a source coupled to the output of the negative charge pump associated with the negative switch circuit, a drain coupled to the gate of the third n-channel field-effect transistor, and a body coupled to the output of the negative charge pump associated with the negative switch circuit; and
  a first p-channel field-effect transistor having a gate coupled to the low-side potential node associated with the negative switch circuit, a source coupled to a high-side potential node, a drain coupled to the gate of the third n-channel field-effect transistor, and a body coupled to the high-side potential node.

47. A negative switch circuit, comprising:

a first switch controllable by a first control signal;

a second switch controllable by a second control signal;

a third switch; and a feedback controller having an input and an output;

wherein the first switch is coupled between an input and an output of the negative switch circuit;

wherein the second switch and the third switch are coupled in series with each other and in parallel with the first switch between the input and the output of the negative switch circuit;

wherein the input of the feedback controller is coupled to the output of the negative switch circuit; and wherein the output of the feedback controller is coupled to provide a feedback control signal for control of the third switch.

48. The negative switch circuit of claim 47, wherein the input of the negative switch circuit is a negative potential node and the output of the negative switch circuit is a load.

49. The negative switch circuit of claim 48, wherein the feedback control signal has a first logic level and a second logic level, and wherein the first logic level is indicative of a defect associated with thee load while the second logic level is not indicative of a defect associated with the load.

50. The negative switch circuit of claim 48, wherein the feedback control signal has a first logic level and a second logic level, and wherein the first logic level is indicative of an electrically shorted load and the second logic level is indicative of an electrically floating load.

51. The negative switch circuit of claim 47, wherein the feedback controller is an inverter circuit.

52. An electronic system, comprising:

a processor; and a non-volatile memory device coupled to the processor, wherein the non-volatile memory device comprises:

a plurality of word line drivers, wherein each word line driver has a low side coupled to a low-side potential node;

at least one negative charge pump; and at least one negative switch circuit, wherein a negative switch circuit is coupled between each low-side potential node and an output of a negative charge pump, and wherein each negative switch circuit comprises:

a first electrical path coupled between the output of the negative charge pump associated with the negative switch circuit and the low-side potential node associated with the negative switch circuit; and a second electrical path coupled in parallel with the first electrical path;

wherein the first electrical path is adapted to present an open circuit between the output of the negative charge pump associated with the negative switch circuit and the low-side potential node associated with the negative switch circuit in response to a first state of a first control signal and to present a closed circuit between the output of the negative charge pump associated with the negative switch circuit and the low-side potential node associated with the negative switch circuit in response to a second state of the first control signal;

wherein the second electrical path is adapted to present an open circuit between the output of the negative charge pump associated with the negative switch circuit and the low-side potential node associated with the negative switch circuit in response to a first state of a second control signal and to permit a closed circuit between the output of the negative charge pump associated with the negative switch circuit and the low-side potential node associated with the negative switch circuit in response to a second state of the second control signal; and wherein the second electrical path is further adapted to present an open circuit between the output of the negative charge pump associated with the negative switch circuit and the low-side potential node associated with the negative switch circuit in response to a first state of a feedback control signal regardless of the state of the second control signal and to permit a closed circuit between the output of the negative charge pump associated with the negative switch circuit and the low-side potential node associated with the negative switch circuit in response to a second state of the feedback control signal when the second control signal is in the second state.

\* \* \* \* \*